United States Patent
Kosowsky et al.

(10) Patent No.: US 8,940,193 B2
(45) Date of Patent: *Jan. 27, 2015

(54) ELECTRONIC DEVICE FOR VOLTAGE SWITCHABLE DIELECTRIC MATERIAL HAVING HIGH ASPECT RATIO PARTICLES

(75) Inventors: Lex Kosowsky, San Jose, CA (US); Robert Fleming, San Jose, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/158,356

(22) Filed: Jun. 10, 2011

(65) Prior Publication Data

US 2011/0234363 A1    Sep. 29, 2011

Related U.S. Application Data

(60) Continuation of application No. 12/703,701, filed on Feb. 10, 2010, now Pat. No. 7,981,325, which is a division of application No. 11/881,896, filed on Jul. 29, 2007, now Pat. No. 7,695,644, which is a continuation-in-part of application No. 11/562,289, filed on Nov. 21, 2006, now Pat. No. 7,825,491, and a continuation-in-part of application No. 11/562,222, filed on Nov. 21, 2006.

(60) Provisional application No. 60/820,786, filed on Jul. 29, 2006, provisional application No. 60/826,746, filed on Sep. 24, 2006.

(51) Int. Cl.
| | | |
|---|---|---|
| H01B 1/06 | (2006.01) | |
| H01B 1/12 | (2006.01) | |
| H01C 7/10 | (2006.01) | |
| B05D 5/12 | (2006.01) | |
| B82Y 10/00 | (2011.01) | |
| H01B 1/22 | (2006.01) | |
| H01B 1/24 | (2006.01) | |
| H01C 7/105 | (2006.01) | |
| H01C 17/065 | (2006.01) | |
| H05K 1/02 | (2006.01) | |
| H05K 3/18 | (2006.01) | |
| H05K 1/03 | (2006.01) | |
| H05K 1/16 | (2006.01) | |

(52) U.S. Cl.
CPC .............. *H01C 7/1006* (2013.01); *B82Y 10/00* (2013.01); *H01B 1/22* (2013.01); *H01B 1/24* (2013.01); *H01C 7/105* (2013.01); *H01C 17/0652* (2013.01); *H05K 1/0257* (2013.01); *H05K 1/0259* (2013.01); *H05K 3/188* (2013.01); *H05K 1/0373* (2013.01); *H05K 1/167* (2013.01); *H05K 2201/0248* (2013.01); *H05K 2201/0257* (2013.01); *H05K 2201/026* (2013.01); *H05K 2201/0272* (2013.01); *H05K 2201/0738* (2013.01); *H05K 2203/0723* (2013.01); *H05K 2203/105* (2013.01); *Y10S 977/742* (2013.01); *Y10S 977/779* (2013.01)
USPC ........ 252/503; 252/507; 252/519.34; 338/20; 427/58; 977/742; 977/779

(58) Field of Classification Search
USPC ........................................... 252/500
See application file for complete search history.

(56) References Cited

U.S. PATENT DOCUMENTS

| | | | | |
|---|---|---|---|---|
| 7,968,014 B2 * | 6/2011 | Kosowsky et al. | ............ | 252/511 |
| 7,968,015 B2 * | 6/2011 | Kosowsky et al. | ............ | 252/511 |
| 7,981,325 B2 * | 7/2011 | Kosowsky et al. | ............ | 252/511 |

* cited by examiner

*Primary Examiner* — Harold Pyon
*Assistant Examiner* — Jaison Thomas
(74) *Attorney, Agent, or Firm* — Kacvinsky Daisak Bluni PLLC

(57) ABSTRACT

One or more embodiments provide for a device that utilizes voltage switchable dielectric material having semi-conductive or conductive materials that have a relatively high aspect ratio for purpose of enhancing mechanical and electrical characteristics of the VSD material on the device.

18 Claims, 8 Drawing Sheets

ELECTRONIC DEVICE FOR VOLTAGE SWITCHABLE DIELECTRIC MATERIAL HAVING HIGH ASPECT RATIO PARTICLES

RELATED APPLICATIONS

This application is a Continuation of U.S. patent application Ser. No. 12/703,701, filed Feb. 10, 2010, which:
  (a) Is a Divisional of U.S. application Ser. No. 11/881,896, filed Jul. 29, 2007, Issued as U.S. Pat. No. 7,695,644 on Apr. 13, 2010;
  (b) Claims benefit of priority to Provisional U.S. Patent Application No. 60/820,786, filed Jul. 29, 2006;
  (c) Claims benefit of priority to Provisional U.S. Patent Application No. 60/826,746, filed Sep. 24, 2006;
  (d) Is a Continuation-In-Part of U.S. patent application Ser. No. 11/562,289, filed Nov. 21, 2006; and
  (e) Is a Continuation-In-Part of U.S. patent application Ser. No. 11/562,222, filed Nov. 21, 2006; and
all of the aforementioned priority applications are hereby incorporated by reference in their entirety.

TECHNICAL FIELD

The disclosed embodiments relate generally to the field of voltage switchable dielectric (VSD) materials. More specifically, embodiments described herein include VSD material that includes conductive or semi-conductive high aspect-ratio (HAR) particles as filler.

BACKGROUND

Voltage switchable dielectric (VSD) material has an increasing number of applications. These include its use on, for example, printed circuit boards and device packages, for purpose of handling transient voltages and electrostatic discharge events (ESD).

Various kinds of conventional VSDM exist. Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665. VSD material can be "SURGX" material manufactured by the SURGX CORPORATION (which is owned by Littlefuse Inc.).

While VSD material has many uses and applications, conventional compositions of the material have had many shortcomings. Typical conventional VSD materials are brittle, prone to scratching or other surface damage, lack adhesive strength, and have a high degree of thermal expansion.

DETAILED DESCRIPTION

Figure 1:
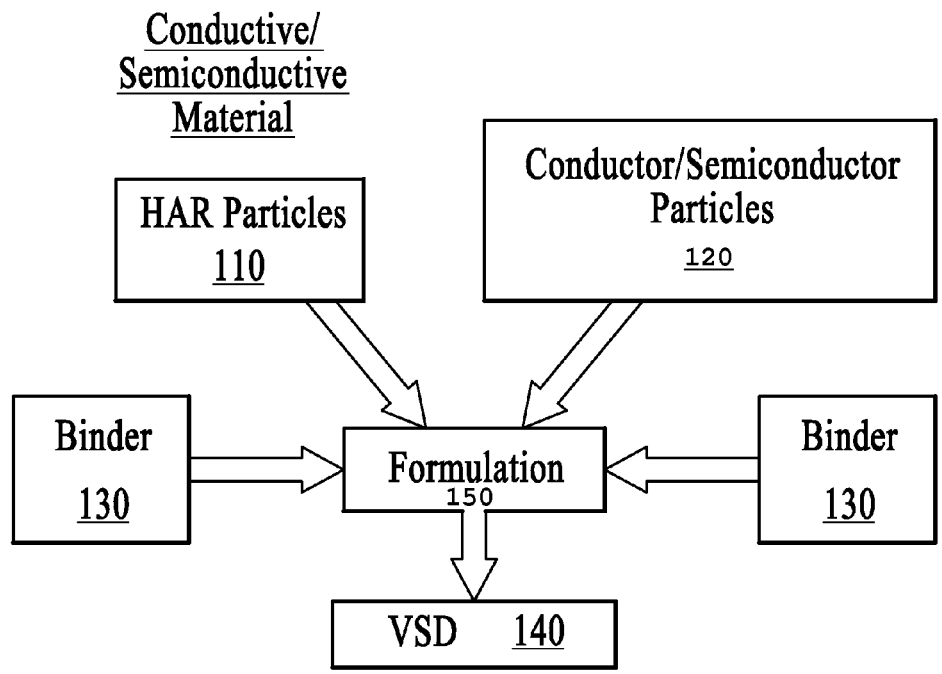
FIG. 1 is a block diagram illustrating components for use in a process of formulating VSD material, according to an embodiment of the invention.

Embodiments described herein provide for devices that incorporate a composition of VSD material that utilizes semiconductive or conductive materials that have a relatively high aspect ratio for purpose of enhancing mechanical and electrical characteristics of the VSD material. Still further, other embodiments contemplate use of nanoscale conductors and semiconductors for use in enhancing the properties and characteristics of VSD material.

In general, "voltage switchable material" or "VSD material" is any composition, or combination of compositions, that has a characteristic of being dielectric or non-conductive, unless a voltage is applied to the material that exceeds a characteristic voltage level of the material, in which case the material becomes conductive. Thus, VSD material is a dielectric unless voltage exceeding the characteristic level (e.g. such as provided by ESD events) is applied to the material, in which case the VSD material is conductive. VSD material can further be characterized as any material that can be characterized as a nonlinear resistance material.

VSD material may also be characterized as being non-layered and uniform in its composition, while exhibiting electrical characteristics as stated.

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

As will be described, one or more embodiments provide for HAR particles to be combined in the binder of the VSD material. The HAR particles may be dispersed as nanoscale particles within the binder to enable reduction of metal loading, enhancement of mechanical properties, and/or improved electrical performance, as compared to more conventional VSD materials.

Among other advantages, embodiments described herein provide for devices that incorporate, integrate or otherwise provide a composition of VSD material that has improved mechanical properties, including properties of high compression strength, scratch resistance and non-brittleness. Additionally, one or more embodiments described herein provide for formulation of VSD material that has high adhesive strength and good ability to adhere to metals such as copper. Numerous other advantages may also be provided with compositions such as described.

Accordingly, one or more embodiments further include a binder for a VSD composition that includes "nanoscale" dimensioned conductive or semi-conductive particles. These may include HAR particles, and in some cases super HAR particles (having aspect ratios of the order of 1000 or more). In this application, nanoscale particles are particles for which a smallest dimension (e.g. diameter or cross-section) is less than 500 nanometers. One or more embodiments contemplate nanoscale particles having a smallest dimension that is less than 100 nm, and still further, other embodiments contemplate a dimension that is less than 50 nm. Examples of such particles include carbon nanotubes, although numerous other kinds of particles are contemplated. Carbon nanotubes are examples of super HAR particles, with aspect ratios of an order of 1000:1 and more. Materials with lesser aspect ratios are also contemplated as an alternative or addition to carbon nanotubes, including one or more of carbon black (L/D of order of 10:1) particles and carbon fiber (L/D of an order of 100:1) particles.

Still further, alternative embodiments contemplate use of nanoscale particles that have moderate aspect ratios. For example, one or more embodiments include combining nanorods with the binder of the VSD material. Some variations of nanorods, formed from metals or semiconductors, have aspect ratios that range between 3-10 nm. Thus, one or more embodiments contemplate use of nanoscale conductors or semiconductors that have moderate aspect ratios.

The amount of such polymer phase particles that may occupy the VSD material is selected so that the VSD remains below (or just below) the percolation threshold. To maintain the VSD material at below the percolation threshold, the amount of metal particles (or other non-polymer phase particles) used in the VSD composition may vary in connection with the amount of polymer particles used. Thus, according to one or more embodiments, the amount of metal particles that can be used to formulate the VSD may be affected slightly (or otherwise) by the amount of (semi-) conductive materials used in the polymer of the VSD composition, so that the material as a whole remains at just below the percolation threshold.

As mentioned, the amount of HAR particles that can be used may be optimized or limited by the electrical characteristic of the VSD material as a whole. In one embodiment, the amount and type of HAR particles may be set to an amount that causes the binder of the VSD material to be just at or below its percolation threshold. In order to provide for the binder to be at this limit, the amount of metal particles that also comprise the VSD material may be adjusted, depending on design parameters and characteristics desired from the VSD.

This enhanced current handling capacity allows for the ability to handle larger energy events than previous ESD materials. Examples of these types of events would be ESD, EFT, EOS and lightning.

Generally, the characteristic voltage of VSD material is measured at volts/length (e.g. per 5 mil). One or more embodiments provide that the VSD material has a characteristic voltage level that exceeds that of an operating circuit. Such voltage levels may be associated with transient conditions, like electrostatic discharge, although embodiments contemplate planned electrical events. Furthermore, one or more embodiments provide that in the absence of the voltage exceeding the characteristic voltage, the material behaves similar to the binder.

Still further, an embodiment provides for VSD material formed from the stated process or method.

Still further, an electronic device may be provided with VSD material in accordance with any of the embodiments described herein.

In an embodiment, the HAR particle or material is single or multi-walled carbon nanotube.

Furthermore, one or more embodiments provide material that is uniformly mixed and/or non-layered material across a cross-section. Such material may be VSD in that it exhibit non-ohmic characteristics, such as the ability to switch from being a dielectric to a conductor with the application of a voltage that exceeds the characteristic voltage.

FIG. 1 is a block diagram illustrating components for use in a process of formulating VSD material, according to embodiments of the invention. In an embodiment, conductive (and/or) semi-conductive high aspect-ratio (HAR) particles 110 are combined with conductor and/or semi-conductor particles 120 to form VSD material 140. As an optional addition, insulator particles may also be combined with the conductor/semiconductor particles 120. Binder 130 may be combined with the HAR particles 110 and the conductive particles to form the VSD material 140. A VSD formulation process 150 may be used to combine the various ingredients of the VSD material 140. Formulation processes for use of VSD material HAR particles 110 are described below, with, for example, an embodiment of FIG. 2.

In one embodiment, the binder 130 is a matrix that retains the HAR particles 110 and the conductor/semi-conductor particles 120. In one embodiment, the HAR particles 110 are dispersed as nanoscale particles. In one embodiment, the amount of HAR particles that are dispersed in the binder place the binder at just below the percolation threshold. As dispersed nanoscale particles, the HAR particles 110 include particles that are both nanoscaled in one or more dimensions (e.g. cross-section, diameter, width) and individually separated from one another. Thus, the formulation process 150 may uniformly distribute the particles within the binder 130.

In one embodiment, HAR particles 110 include organic conductive or semi-conductive particles, and in particular elongated particles that are carbon-only. For example, HAR particles 110 may correspond to elongated or cylindrical fullerenes, including carbon nanotubes or even carbon black. The carbon nanotubes may be a single or multi-wall variety.

As an addition or alternative, HAR particles 110 may correspond to conductive or semi-conductive inorganic particles, such as provided by nanowires or certain types of nanorods. Material for such particles include copper, nickel, gold, silver, cobalt, zinc oxide, tin oxide, silicon carbide, gallium arsenide, aluminum oxide, aluminum nitride, titanium dioxide, antimony, boron nitride, tin oxide, indium tin oxide, indium zinc oxide, bismuth oxide, cerium oxide, and antimony zinc oxide.

In an embodiment, the conductor/semi-conductor particles 120 include conductors such as metals, in combination with semiconductor particles that include silicon, silicon carbide, titanium dioxide, boron nitride, aluminum nitride, nickel oxide, zinc oxide, zinc sulfide, bismuth oxide, cerium oxide, iron oxide, metal or/and complexes selected from a group consisting of oxides, metal nitrides, metal carbides, metal borides, metal sulfides, or a combination thereof.

According to one or more embodiments, other ingredients or components for use in the formation process 150 include solvents and catalysts. Solvents may be added to the binder 130 to separate particles that would otherwise be lumped or agglomerated at nanoscale. A mixing process may also be used to uniformly space separated particles. In one embodiment, the result of the mixing process is that the composition is uniformly mixed to disperse particles at the nanoscale. Thus, particles such as carbon nanotubes or other HAR particles may be separated out individually and distributed relatively evenly in the material. In order to achieve nanoscale dispersion, one or more embodiments provide for use of sonic agitators and sophisticated mixing equipment (e.g. such as rotor-stator mixers, ball mills, mini-mills, and other high shear mixing technologies), over a duration that lasts several hours or longer. Once mixed, the resulting mixture may be cured or dried.

The binder 130 may also be of various types. The binder 130 may be provided in the form of a binder that retains the HAR particles 110 and the conductor/semi-conductor particles 120. According to different embodiments, the binder 130 is formed from a material selected from a group consisting of silicone polymers, phenolic resins, epoxy, phenolic resin, polyurethane, poly(meth)acrylate, polyamide, polyester, polycarbonate, polyacrylamides, polyimide, polyethylene, polypropylene, polyphenylene oxide, polysulphone, sol-gel materials, and ceramers. The binder 130 may correspond to a binder that suspends and/or retains the HAR particles 110, conductor/semi-conductor particles 120, as well as other particles or compounds that comprise the VSD material 140.

VSD Formulation with HAR Material

Broadly, embodiments provide for use of VSD material that includes, by percentage of volume, 5-99% binder, 0-70% conductor, 0-90% semiconductor, and HAR material that is conductive or semi-conductive and having a volume of composition in a range of 0.01-95%. One or more embodiments provide for use of VSD material that includes, by percentage of volume, 20 to 80% binder, 10 to 50% conductor, 0% to 70% semiconductor, and HAR material that is conductive or semi-conductive and having a volume of the composition in a range of 0.01-40%. Still further, one or more embodiments provide for use of VSD material that includes, by percentage of volume, 30 to 70% binder, 15 to 45% conductor, 0% to 50% semiconductor, and HAR material that is conductive or semi-conductive and having a volume of the composition in a range of 0.01-25%. Examples of binder materials include silicone polymers, epoxy, polyimide, phenolic resins, polyethylene, polypropylene, polyphenylene oxide, polysulphone, solgel materials, ceramers, and inorganic polymers. Examples of conductive materials include metals such as copper, aluminum, nickel, silver, gold, titanium, stainless steel, chrome, and other metal alloys. Examples of semiconductive material include both organic and inorganic semiconductors. Some inorganic semiconductors include silicon, silicon carbide, boron nitride, aluminum nitride, nickel oxide, zinc oxide, zinc sulfide, bismuth oxide, and iron oxide. The specific formulation and composition may be selected for mechanical and electrical properties that best suit the particular application of the VSD material.

Figure 2:
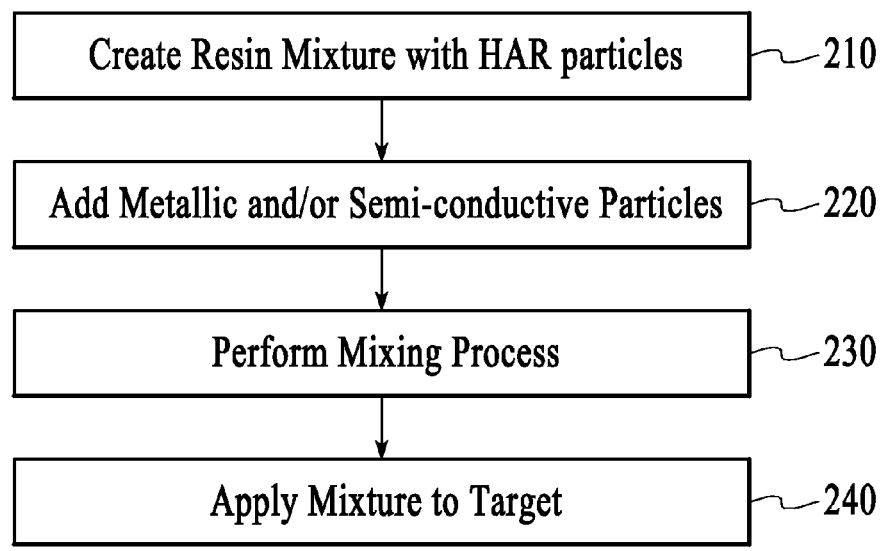
FIG. 2 illustrates a process for formulating a composition of VSD material having high aspect ratio particles in a binder, under an embodiment of the invention.

FIG. 2 illustrates a process for formulating a composition of VSD material having HAR material, according to an embodiment of the invention. Initially, in a step 210, a resin mixture is created containing a combination of conductor and semi-conductor particles, as well as HAR particles that serve as fillers to reduce conductor/semiconductor particle composition in the binder. The resin mixture may serve as the binder of the VSD material when formulation is complete. In one embodiment, the HAR particles may correspond to carbon nanotubes. Other embodiments provide for use of nanowires or nanorods.

According to one embodiment, the amount of HAR particles added to the mixture is designated to maintain the mixture as a whole at just below percolation threshold. However, the amount of HAR particles that are present may vary, depending on the desired percentage by volume of the particles in the formulated VSD material. In one embodiment in which carbon nanotubes are used as the HAR particles, the quantity of carbon nanotubes added to the resin results in carbon nanotubes having a percentage by weight of less than 10% of the overall composition, and more specifically between 0.1% and 10% of the formulated VSD material. Embodiments described herein recognize that the amount of HAR particles used in the binder to achieve a desired effect may depend on the aspect ratio of the material being considered. For example, the binder may include more than 10% HAR particles if the aspect ratio of the individual HAR particles is relatively low. As a more specific example, particles with aspect ratios of 1000:1 may occupy 1% by weight of the overall material, while particles with individual aspect ratios of 10:1 may require 25% or more.

In step 220, metallic and/or inorganic conductors/semiconductors are added to the mixture. As described with an embodiment of FIG. 1, numerous types of conductors or semi-conductors may be used. More than one kind of organic/semiconductor particle may be added. In one embodiment, Titanium dioxide ($TiO_2$) is used as the (or one of the) primary types of conductive/semiconductive particles, along with additional conductor particles. Additional curative and catalyst constituents may also be added to the mixture.

In step 230, a mixing process may be performed over a designated duration. In one embodiment, the mixing process is performed with mixing equipment, including sonic agitators, for a duration that that extends for minutes or hours. The mixing process serves to disperse the HAR particles at a nanoscale level. One result of mixing to such degree is that at least some of the HAR particles are substantially suspended apart from one another within the binder, so as to not agglomerated or lumped together. Given that the HAR particles individually may include one or more dimensions at the nanoscale, such mixing further enables nanoscale dispersion within the binder.

In step 240, the mixture is applied to its desired target. For example, the mixture may be applied to across a 5 mil gap between two given electrodes of a particular device. At the target location, the mixture is cured into VSD material.

As described with an embodiment of FIG. 1, the resulting VSD material has numerous improved mechanical properties over more conventional VSD material. For example, among other improvements that may result, the VSD material formulated in accordance with an embodiment such as described may be less brittle, have better compression strength, adhere better to metals (particularly copper), and/or have better aesthetic properties.

Example Formulation and Composition

A compound in accordance with embodiments described herein may be formulated as follows: HAR particles may be provided in the form of carbon nanotubes (CNT), which are added to a suitable resin mixture. In one embodiment, the resin mixture includes Epon 828 and a silane coupling agent. NMP (N-methyl-2pyrrolidone) may be added to the resin mixture. Subsequently, conductor or semiconductor particles may be added to the mixture. In one embodiment, titanium dioxide is mixed into the resin, along with titanium nitride, titanium diboride, a curative compound or agent, and a catalyst agent. The mixture may be uniformly mixed for a mixing duration that lasts hours (e.g. 8 hours) using, for example, rotor-stator mixer with sonication. NMP may be added as necessary for the mixing duration. The resulting mixture may be applied as a coating using #50 wire wound rod or screen print on a desired target. In one embodiment, the coating may be applied across a 5 mil gap between 2 electrodes. Subsequently, a cure process may take place that may be varied. One suitable curing process includes curing for ten minutes at 75 C, ten minutes at 125 C, 45 minutes at 175 C, and 30 minutes at 187 C.

Specific formulations may vary based on design criteria and application. One example of a formulation in which carbon nanotubes are used HAR particles of the binder of the VSD material include:

|  | Weight (g) |
| --- | --- |
| CheapTubes | 5.4 |
| Epon 828 | 100 |
| Gelest Aminopropyltriethoxysilane | 4 |
| Total Epoxy | 104 |
| Nanophase Bismuth Oxide | 98 |
| HC Starck TiN— | 164 |
| Degussa Dyhard T03 | 4.575 |
| NMP | 25.925 |
| Curative Soln. | 30.5 |
| 1-methylimidazole | 0.6 |
| HC Stark TiB2— | 149 |
| Millenium Chemical Doped TiO2— | 190 |
| NMP | 250 |
| Total Solution | 986.1 |
| Total Solids | 715.575 |
| Epoxy:Amin Equiv Ratio % Solids | 72.6% |

*Curative Solution is a 15% by weight solution of Dyhard T03 dissolved in NMP.

Carbon nanotubes have the benefit of being organic filler. The lengths or aspect ratios may be varied to achieve a desired property, such as switching voltage for the material.

Figure 3A:
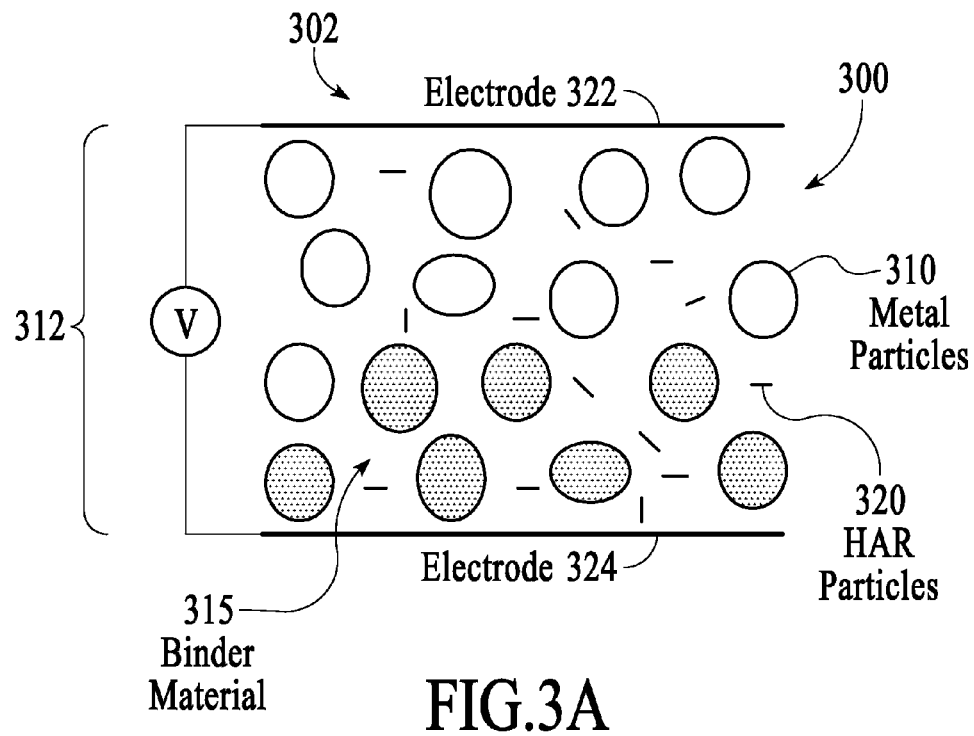
FIG. 3A is a cross-sectional illustration of VSD material, where the VSD material is formulated in accordance with one or more embodiments of the invention.

FIG. 3A is a cross-sectional illustration of VSD material provided on a device 302, where the VSD material is formulated in accordance with one or more embodiments of the invention. In an embodiment, a thickness or layer or VSD material 300 includes basic constituents of metal particles 310, binder material 315, and HAR particles 320 (e.g. carbon nanotubes, nanowires).

Embodiments recognize, however, that carbon nanotubes have considerable length to width ratio. This dimensional property enables carbon nanotubes to enhance the ability of the binder to pass electrons from conductive particle to conductive particle in the occurrence of a transient voltage that exceeds the characteristic voltage. In this way, carbon nanotubes can reduce the amount of metal loading present in the VSD material. By reducing the metal loading, physical characteristics of the layer may be improved. For example, as mentioned with one or more other embodiments, the reduction of metal loading reduces the brittleness of the VSD material 300.

As described with an embodiment of FIG. 2, the VSD material 300 may be formed on device 302 by being deposited as a mixture on a target location of the device 302. The target location may correspond to a span 312 between a first and second electrode 322, 324. According to one or more embodiments, the span 312 is about (i.e. within 60%) 3.0 mil, 5.0 mil, or 7.5 mil for applications such as printed circuit boards. However, the exact distance of the span 312 may vary based on design specification. In PCB applications, the range may vary, for example, between 2 and 10 mils. In semi-conductor packages, the value may be much less. Application of the VSD material in the gap enables handling of current that result from transient voltages that exceed the characteristic voltage of the VSD material.

Device 302 may be used with any one of many kinds of electrical devices. In an embodiment, device 302 may be implemented as part of a printed circuit board. For example, the VSD material 300 may be provided as a thickness that is on the surface of the board, or within the board's thickness. Device 302 may further be provided as part of a semi-conductor package, or discrete device.

Alternatively, device 302 may correspond to, for example, a light-emitting diode, a radio-frequency tag or device, or a semiconductor package.

As described with other embodiments, VSD material, when applied to a target location of a device, may be characterized by electrical properties such as characteristic (or trigger) voltage, clamp voltage, leakage current and current carrying capacity. Embodiments described herein provide for use of HAR particles in a mixture that enables adjustment of electrical properties such as described, while maintaining several desired mechanical properties described elsewhere in this application.

Figure 3B:
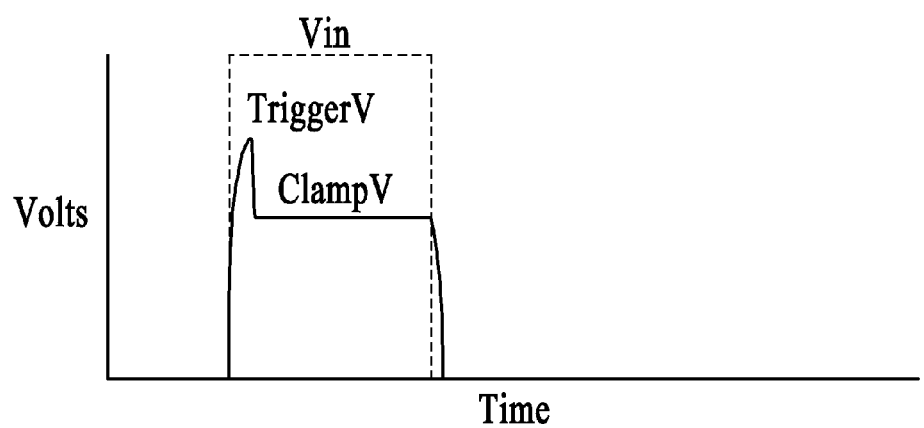
FIG. 3B illustrates a graph of basic electrical properties of clamp and trigger voltage for VSD material, in accordance with embodiments such as described with FIG. 3A and elsewhere.

FIG. 3B illustrates a graph of basic electrical properties of clamp and trigger voltage for VSD material, in accordance with embodiments such as described with FIG. 3A and elsewhere in this application. Generally, the characteristic or trigger voltage is the voltage level (which may vary per unit length) by which the VSD material turns on or becomes conductive. The clamp voltage is typically less than or equal to the trigger voltage and is the voltage required to maintain the VSD material in the on-state. In some cases when the VSD material is provided between two or more electrodes, the trigger and clamp voltages may be measured as output across the VSD material itself. Thus, the on-state of the VSD material may be maintained by maintaining the input voltage level at above the clamp voltage, for a duration that is less than the break down threshold energy or time. In application, the trigger and/or clamp voltages may be varied as a result of an input signal that is spiked, pulsed, shaped or even modulated over several pulses.

Embodiments further recognize that another electrical property of interest includes off-state resistance, determined by measuring current through operational voltages of the device. The resistivity of the off-state may correspond to the leakage current. A change in off-state resistivity as compared to before and after when the VSD material is turned on and off signals degradation of the performance of the VSD material. In most cases, this should be minimized.

Still further, another electrical characteristic may correspond to current carrying capacity, measured as the ability of the material to sustain itself after being turned on, then off.

Table 1 lists another formulation of VSD material, in which the HAR particle used in the binder is antimony tin oxide (ATO) Nanorods, in accordance with one or more embodiments.

| Material | Example 1 |
| --- | --- |
| Ishihara Corp FS-10P ATO nanorods | 14.4 |
| HC Starck TiB2 | 150.0 |
| Gelest SIA610.1 | 4.0 |
| Millenium Chemical TiO2 | 190.0 |

-continued

| Material | Example 1 |
|---|---|
| Lubrizole D510 | 9.8 |
| Nanophase Bi2O3 | 98.0 |
| HC Starck TiN | 164.0 |
| Epon 828 (Hexion) | 87.15 |
| Degussa Dyhard T03 | 4.49 |
| 1-methylimidazole | 0.62 |
| N-methylpyrrolidinone | 275.4 |
| Gap | 5 mil |
| Trigger Voltage | 447 |
| Clamp Voltage | 320 |

Table 2 lists several additional examples in which the VSD material is composed of carbon nanotubes as the HAR particles in accordance with one or more embodiments described herein. Table 2 lists generically measured electrical properties (meaning no differentiation is provided between forms of input signal and/or manner in which data for electrical properties is determined), as quantified by clamp and trigger voltages that result from use of the VSD material in accordance with the stated composition.

TABLE 2

| Material | Example 1 Weight (g) | Example 2 Weight (g) | Example 3 Weight (g) | Example 4 Weight (g) |
|---|---|---|---|---|
| Hyperion CP-1203 | 0 | 31.29 | 0 | 40.86 |
| Nickel INP400 | 216.27 | 221.49 | 0 | 0 |
| Momentive TiB2 (formerly GE) | 0 | 0 | 55.36 | 55.4 |
| Saint Gobain BN | 0 | 0 | 0 | 0 |
| Epon 828 (Hexion) | 40.13 | 10.09 | 51.06 | 12.18 |
| Degussa Dyhard T03 | 1.83 | 1.83 | 2.34 | 2.33 |
| 1-methylimidazole | 0.1 | 0.13 | 0.3 | 0.3 |
| imidazoledicarbonitrile | 0 | 0 | 0 | 0 |
| Methylaminoantracene | 0 | 0 | 0 | 0 |
| Millenium Chemical TiO2 | 0 | 0 | 85.03 | 85.79 |
| N-methylpyrrolidinone | 80.37 | 80.46 | 83.5 | 123.4 |
| Gap | 5 mil | 5 mil | 5 mil | 5 mil |
| Trigger Voltage | 250 | 170 | 1475 | 775 |
| Clamp Voltage | 100 | 70 | 1380 | 220 |

With respect to Table 2, Example 1 provides a composition of VSD material that is a basis for comparison with other examples. In Example 1, HAR particles are not present in the VSD material. Furthermore, the VSD material has relatively high metal loading. Example 2 illustrates a similar composition as to Example 1, but with the introduction of carbon nanotubes as the HAR particles. The result is a reduction in trigger and clamp voltage. Trigger and clamp voltages are reduced by adding carbon nanotubes at a given (constant) nickel loading.

Example 3 also illustrates a VSD composition that lacks carbon nanotubes as HAR particles, while Example 4 illustrates effect of including carbon nanotubes into the mixture. As shown, a dramatic reduction in the trigger and clamp voltages is shown. With regard to Example 3 and Example 4, both compositions illustrate compositions that have desirable mechanical characteristics, as well as characteristics of off-state resitivity and current-carrying capacity (neither of which are referenced in the chart). However, the clamp and trigger voltage values of Example 3 illustrate the composition, without inclusion of carbon nanotubes, is difficult to turn on and maintain on. Abnormally high trigger and clamp voltages thus reduce the usefulness of the composition.

Figure 3C:
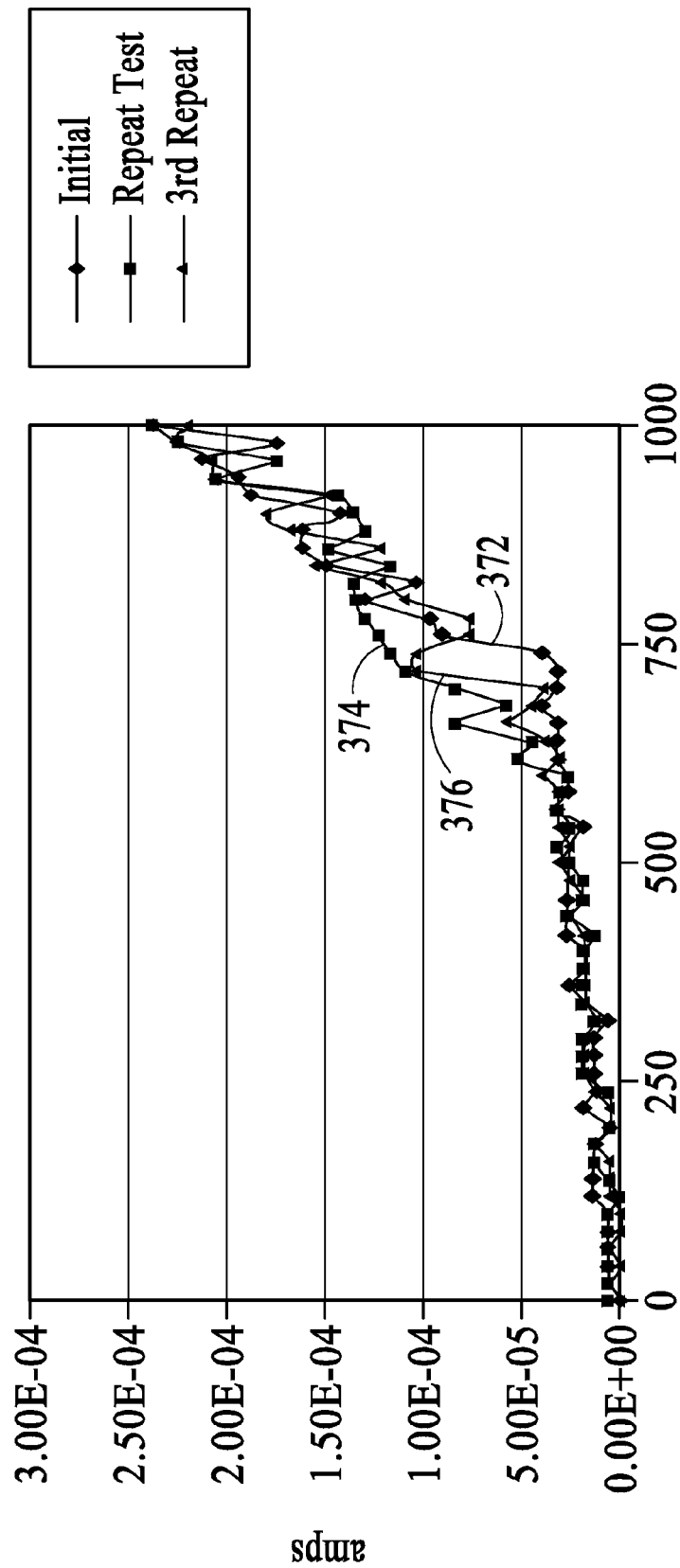
FIG. 3C-FIG. 3E illustrate voltage by current performance graphs of different examples of VSD material, responding to the occurrence of voltage events, under one or more embodiments of the invention.
Figure 3D:
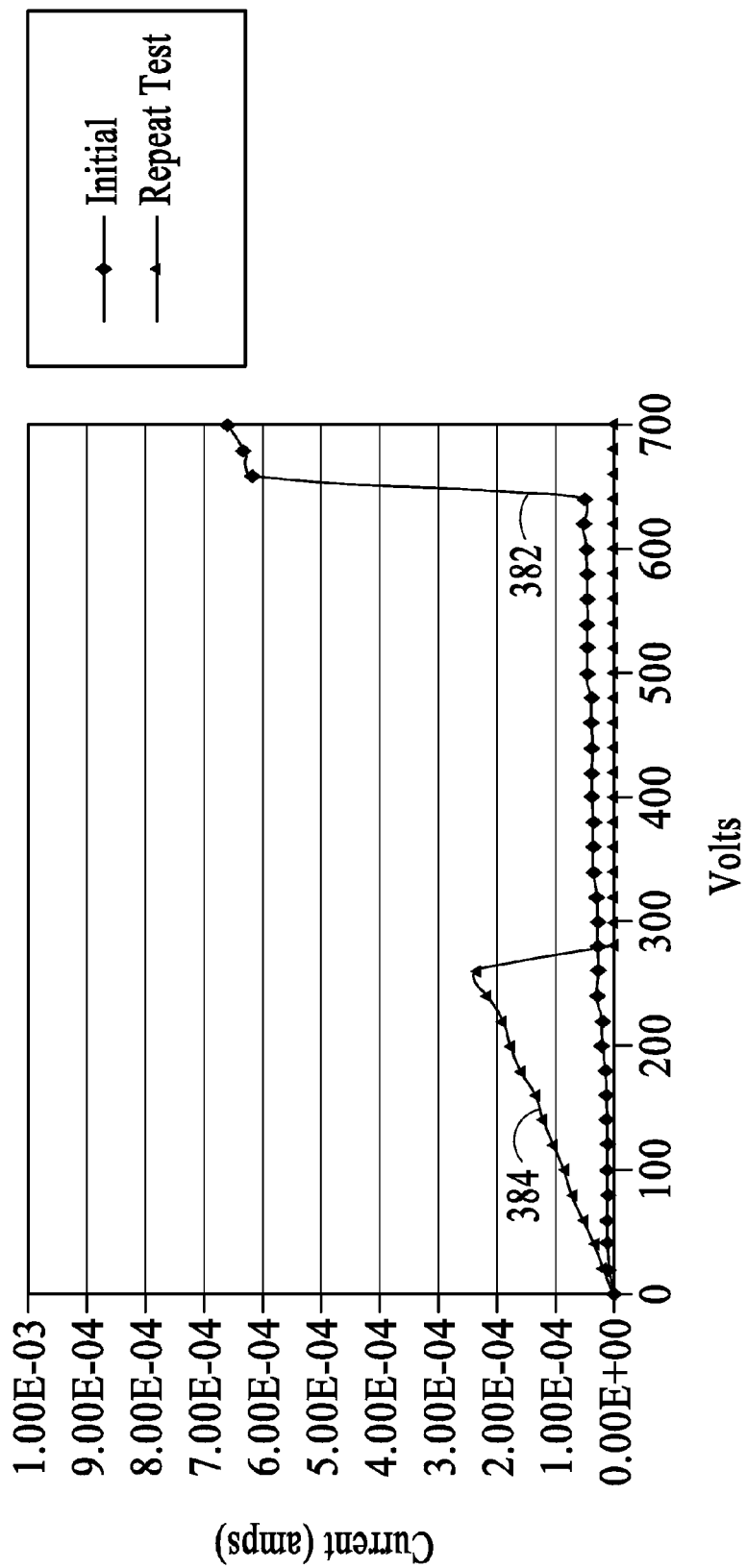
Figure 3E:
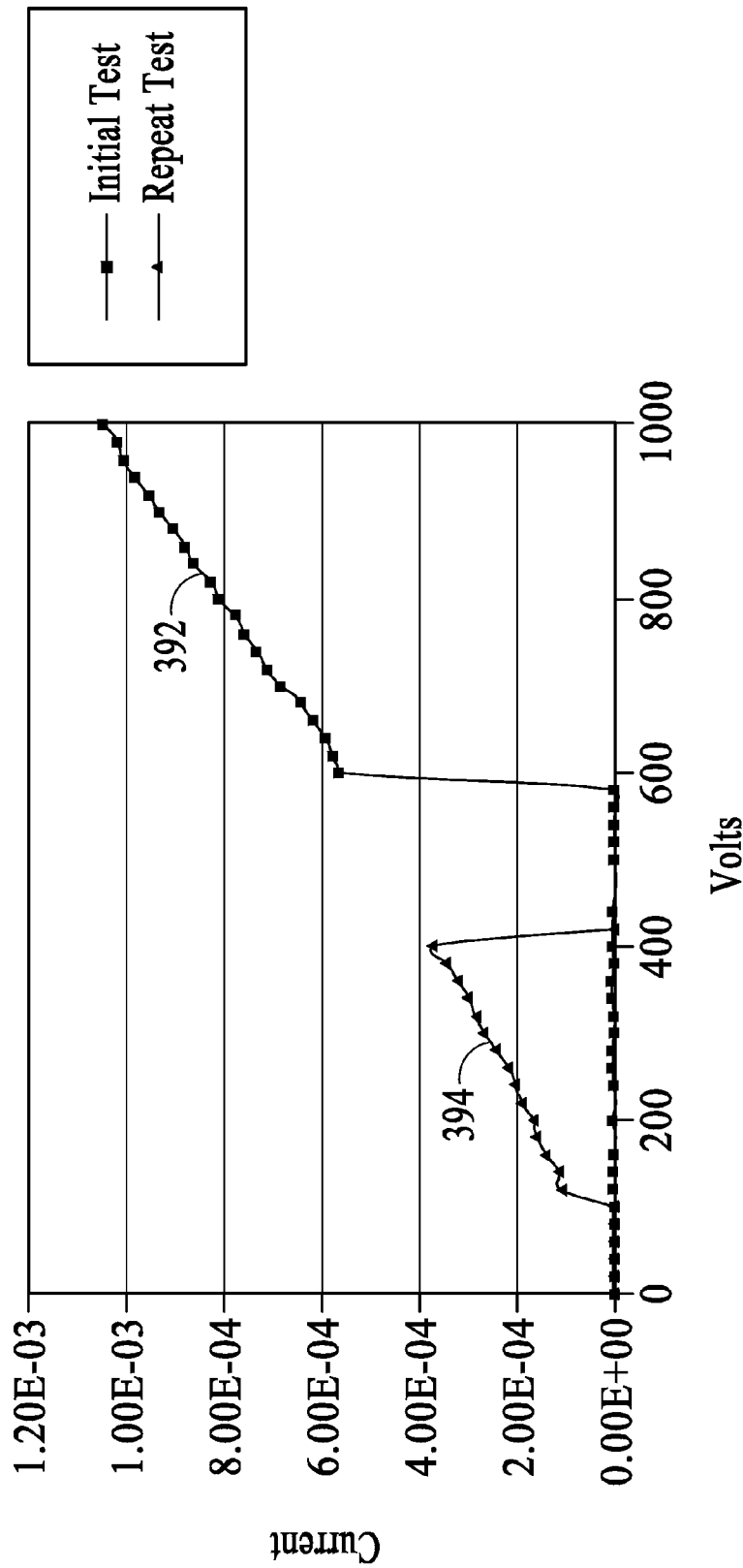

The performance diagrams shown with FIG. 3C-3E assume pulsed voltage inputs. The performance diagrams may be referenced to the examples provided in the following table.

TABLE 3

| Material | Example 5 Weight (g) | Example 6 Weight (g) | Example 7 Weight (g) |
|---|---|---|---|
| Hyperion CP1203 | 21.0 | 0 | 1.0 |
| Hexion Epon 828 | 50.25 | 0 | 5 |
| Cabosil coated Aluminum | 40.33 | 26.33 | 0 |
| ATA5669 aluminum | 0 | 0 | 13.76 |
| Degussa Dyhard T03 | 3.22 | 0.8 | 0.6 |
| Methoxyethanol | 25.8 | 6.39 | 4.68 |
| 1-methylimidazole | 0.06 | 0.04 | 0.04 |
| Hexion Epon SU-8 | 0 | 19.55 | 14.32 |
| Methyl ethyl ketone | 0 | 11.73 | 6.6 |
| Cabosil coated Alumina | 0 | 15.31 | 0 |

FIG. 3C is a diagram that illustrates a performance diagram for VSD material that has a relatively large quantity of concentration of carbon nanotubes (as HAR particles) in the binder of the VSD material, as described by Example 5. As shown by the diagram of FIG. 3C, the occurrence of an initial voltage event 372 in the range of 500-1000 volts results in the material turning on, so as to carry current. Application of a second voltage event 374 after the device turns off from the first event results in a similar effect as the initial event 372, in the material carries currents at relatively the same voltage levels. The occurrence of the third voltage event 376 after the device turns off the second time results in a similar result in the amperage carried in the VSD material as the first two occurrences. As such FIG. 3C illustrates the VSD material of the composition in Example 5 has relatively-high current carrying capacity, in that the VSD material remains effective after two instances of switching on and off.

FIG. 3D correlates to Example 6, which is a VSD composition that contains no conductive or semi-conductive organic material. While the VSD material is effective in the first voltage event 382, there is no detectable non-linear behavior (i.e. turn-on voltage) when the subsequent second voltage event 384 occurs.

FIG. 3E correlates to Example 7, which has fewer amount of HAR particles in the form of carbon nanotubes. The light addition of such conductive/semi-conductive HAR particles improves the current carrying capacity of the VSD material, as shown by the amperage of the first voltage event 392 and the lesser (but present) amperage of the second voltage event 394.

Coated Conductive or Semi-Conductive Particles

One or more embodiments include a formulation of VSD material that includes the use of conductive or semi-conductive HAR particle micro-fillers that are coated or otherwise combined onto a periphery of a metal particle. Such formulation allows for additional reduction in the size of the metal particle and/or volume that would otherwise be occupied by the metal particle. Such reduction may improve the overall physical characteristics of the VSD material, in a manner described with other embodiments.

As described below, one or more embodiments provide for the use of HAR particle micro-fillers that coat or bond metal or other inorganic conductor elements. One objective of coating the inorganic/metal particles with HAR particles is to generally maintain overall effective volume of the conductive material in the binder of the VSD material, while reducing a volume of metal particles in use.

Figure 4:
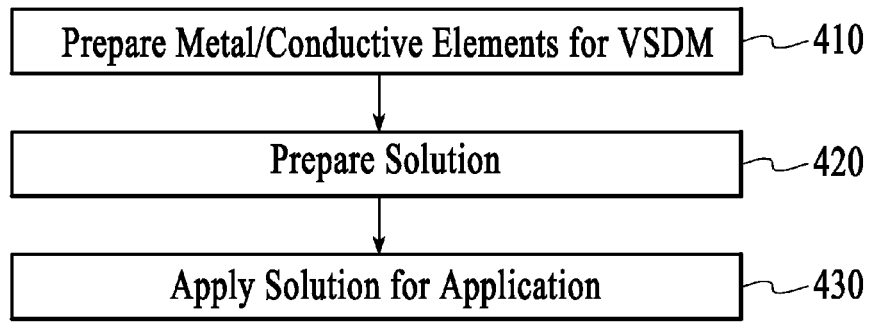
FIG. 4 illustrates another process by which VSD material may include HAR particles for coating conductors or semiconductor particles, under an embodiment of the invention.

FIG. 4 illustrates a more detailed process by which VSD material can be formulated, under an embodiment of the invention. According to a step 410, the conductive elements (or semi-conductive) that are to be loaded into a binder for VSD formulation are initially prepared. This step may include combining HAR particles (e.g. carbon nanotubes)

with particles that are to be coated so as to create a desired effect when the end mixture is cured.

In one implementation, separate preparation steps are performed for the metal and metal oxide particles. Under one embodiment, step 410 may include sub-steps of filtering aluminum and alumina powder. Each of the powder sets are then coated with HAR particles to form the conductive/semi-conductive element. In one implementation, the following process may be used for aluminum: (i) add 1-2 millimole of silane per gram of Aluminum (dispersed in an organic solvent); (ii) apply sonic applicator to distribute particles; (iii) let react 24 hours with stirring; (iv) weigh out Cab-O-Sil or organic conductor into solution; (v) add suitable solvent to Cab-O-Sil or organic conductor mix; (vi) add Cab-O-Sil and/or organic conductor to collection with Aluminum; and (vii) dry overnight at 30-50 C.

Similarly, the following process may be used by used for the Alumina: (i) add 1-2 millimole of silane per gram of Alumina (dispersed in an organic solvent); (ii) apply sonic applicator to distribute particles; (iii) let react 24 hours with stirring; (iv) weigh out Cab-O-Sil or organic conductor into solution; (v) add Cab-O-Sil and/or organic conductor to collection with Alumina; (vi) dry overnight at 30-50 C.

According to an embodiment, HAR particles such as carbon nanotubes or nanowires may be used in coating or preparing the conductive elements. The carbon nanotubes may be biased to stand on end when bonded with the metal particles, so as to extend conductive length of the particles, while at the same time reducing the overall volume of metal needed. This may be accomplished by placing a chemical reactive agent on the surface perimeter of the metal particles that are to form conductors within the VSD material. In one embodiment, the metal particles may be treated with a chemical that is reactive to another chemical that is positioned at the longitudinal end of the HAR particle (e.g. carbon nanotube). The metal particles may be treated with, for example, a Silane coupling agent. The ends of the HAR particles may be treated with the reactive agent, to enable end-wise bonding of the carbon nano-tubes to the surface of the metal particles.

In step 420, a mixture is prepared. Binder material may be dissolved in an appropriate solvent. Desired viscosity may be achieved by adding more or less solvent. The conductive elements (or semi-conductive elements from step 410) are added to the binder materials. The solution may be mixed to form uniform distribution. Appropriate curative may then be added.

In step 430, the solution from step 420 is integrated or provided onto a target application (i.e. a substrate, or discrete element or a Light Emitting Diode or Organic LED), then heated or cured to form a solid VSD material. Prior to heating, the VSD material may be shaped or coated for the particular application of the VSD material. Various applications for VSD material with HAR particle coating or bonding with metallic or inorganic conductors/semiconductors exist.

Figure 5A:
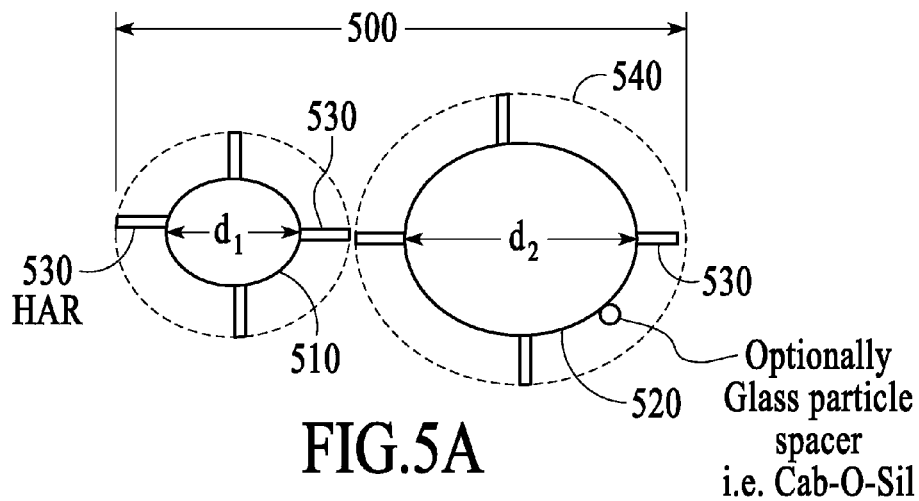
FIG. 5A and FIG. 5B illustrate how application of HAR particles to coat the surface of the metal/inorganic conductor or semiconductor particles can reduce the loading of such particles in the VSD material, under an embodiment of the invention.
Figure 5B:
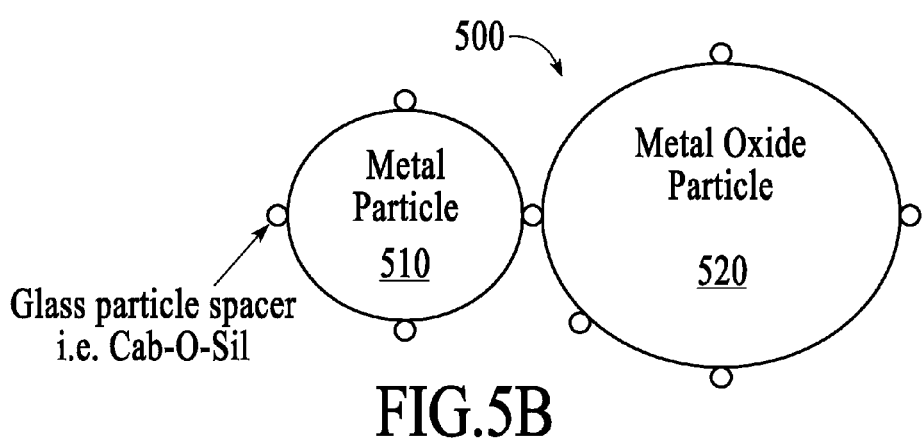

FIG. 5A and FIG. 5B illustrate how application of HAR particles to coat or bind the surface of the metal/inorganic conductor or semiconductors can reduce loading of such particles, under an embodiment of the invention. FIG. 5A is a simplified illustration of how conductor and/or semiconductor particles in a binder of the VSD material can be surface coated with carbon nanotubes. As shown, conductive element 500 includes a metal particle 510 and a metal oxide or other optional inorganic semi-conductor particle 520. The metal particle 510 may have a dimension represented by a diameter d1, while the metal oxide particle 520 may have a dimension represented by d2. In an embodiment shown by FIG. 5A, HAR particle fillers 530 (e.g. carbon nanotubes) are bonded or combined with a periphery of the respective particles 510, 520. As the HAR particle fillers 530 are conductive or semi-conductive, the effect is to increase the size of the particles 510, 520 without increasing the volume of those particles in the binder of the VSD material. The presence of the HAR particle fillers enables conduction, or electron hopping or tunneling from molecule to molecule when voltage exceeding the characteristic voltage occurs. The conductive element 500 may in fact be semi-conductive, in that conductive element 500 may have the property of being collectively conductive when a characteristic voltage is exceeded.

In FIG. 5B, a conventional VSD material is shown without addition of HAR particles. Metal particles 510, 520 are relatively closely spaced in order to pass charge when voltage exceeding the characteristic voltage is applied. As a result of more closely spaced conductors, more metal loading is required to enable the device to switch to a conductor state. In comparison to an embodiment such as illustrated by FIG. 5A, under a conventional approach shown by FIG. 5B, the particles 510, 520 are spaced by glass particle spaces (e.g. Cab-O-Sil), an embodiment such as shown in FIG. 5A substitutes metal volume with conductive fillers 530 that are conductive, have desirable physical properties, and have dimensions to adequately substitute for metal.

Figure 5C:
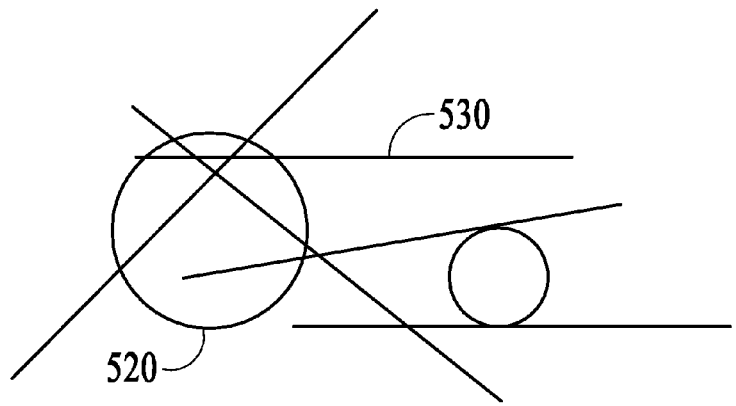
FIG. 5C illustrates a relatively disorganized distribution of HAR particles as fillers in a binder of VSD material, when such particles are dispersed at nanoscale in the binder, according to an embodiment of the invention.

FIG. 5C illustrates a relatively disorganized distribution of HAR particle fillers (e.g. carbon nanotubes), reflecting how the HAR particle fillers, when uniformly dispersed at nanoscale, inherently produce results that are similar to those desired from the simplified illustration of FIG. 5A. A description of FIG. 5C may reflect embodiments such as shown and described with FIG. 3 or elsewhere in this application. As shown, a number of uniformly distributed conductive/semi-conductive HAR particle fillers 530 enables sufficient touching and/or proximity to enable a conductive path for handling current, including through electron tunneling and hopping. This allows improvement in electrical and physical characteristics, particularly in relation to reduction of metal loading in the binder of the VSD material. Moreover, when particles are evenly dispersed at nanoscale within the binder, less HAR particle 530 is needed to produce the desired electrical conductivity effect.

VSD Material Applications

Numerous applications exist for VSD material in accordance with any of the embodiments described herein. In particular, embodiments provide for VSD material to be provided on substrate devices, such as printed circuit boards, semiconductor packages, discrete devices, as well as more specific applications such as LEDs and radio-frequency devices (e.g. RFID tags). Still further, other applications may provide for use of VSD material such as described herein with a liquid crystal display, organic light emissive display, electrochromic display, electrophoretic display, or back plane driver for such devices. The purpose for including the VSD material may be to enhance handling of transient and overvoltage conditions, such as may arise with ESD events. Another application for VSD material includes metal deposition, as described in U.S. Pat. No. 6,797,145 to L. Kosowsky (which is hereby incorporated by reference in its entirety).

Figure 6A:
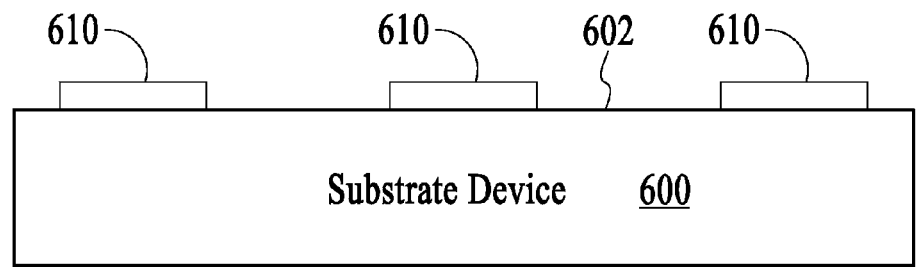
FIG. 6A and FIG. 6B each illustrate different configurations for a substrate device that is configured with VSD material having HAR particles distributed in its binder, under an embodiment of the invention.
Figure 6B:
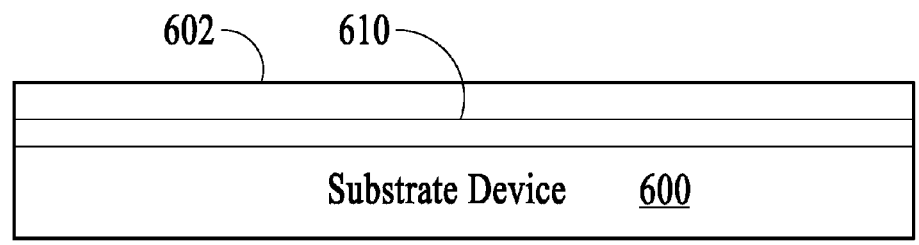

FIG. 6A and FIG. 6B each illustrate different configurations for a substrate device that is configured with VSD material having high aspect-ratio particles as filler ("HAR particled VSD"), under an embodiment of the invention. In FIG. 6A, the substrate device 600 may correspond to, for example, a printed circuit board. In such a configuration, HAR particled VSD 610 may be provided on a surface 602 to ground a connected element. As an alternative or variation, FIG. 6B illustrates a configuration in which the HAR particled VSD forms a grounding path within a thickness 610 of the substrate.

Electroplating

In addition to inclusion of the VSD material on devices for handling, for example, ESD events, one or more embodiments contemplate use of VSD material to form substrate devices, including trace elements on substrates, and interconnect elements such as vias. U.S. Pat. No. 6,797,145 (incorporated herein in its entirety) recites numerous techniques for electroplating substrates, vias and other devices using VSD material. Embodiments described herein enable use of HAR particled VSD material, as described with any of the embodiments in this application.

Figure 7:
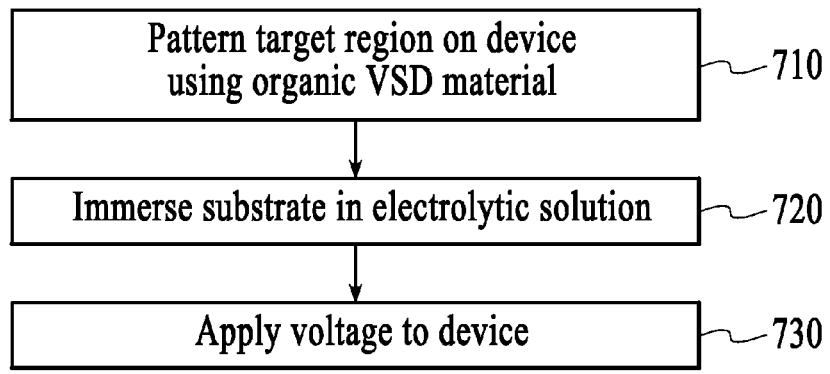
FIG. 7 illustrates a process for electroplating, using organic VSD material in accordance with any of the embodiments described with FIG. 1-5C.

FIG. 7 illustrates a process for electroplating, using HAR particled VSD material in accordance with any of the embodiments described with FIG. 1-5. The enhanced physical and electrical properties provided by embodiments described herein facilitate electroplating processes such as described in U.S. Pat. No. 6,797,145. FIG. 7 describes a simplified electroplating process, such as described in U.S. Pat. No. 6,797, 145, in which the VSD material used is in accordance with any of the embodiments described with FIG. 1 thru FIG. 5.

In FIG. 7, a basic electroplating technique is described, according to one or more embodiments of the invention. In a step 710, a target region of a device (e.g. a substrate) is patterned using HAR particled VSD material. The patterning may be performed by, for example, applying a continuous layer of VSD over a substrate, then placing a mask over the VSD layer. The mask may define the negative pattern of the desired electrical/trace pattern. Alternatives are also possible. For example, the VSD material may be applied to the entire region, and then selectively removed to expose regions that are intended to not have current-carrying elements. Still further, the VSD material may be pre-patterned on the target region.

Step 720 provides that the substrate is immersed in an electrolytic solution.

Step 730 provides that a voltage in excess of the characteristic voltage is applied to the patterned region of the device. The application of the voltage may be pulsed to occur for a designated duration of time that is less than the break-down time. The break-down time may correspond to the minimum duration in which the HAR particled VSD material is known to break-down when the given voltage is applied. At break-down, the HAR particled VSD material may lose its electrical characteristics, including its switching characteristics. The pattern of current carrying traces and elements may substantially match that of the HAR particled VSD material. In the electrolytic solution, charged elements attract and bond to the exposed regions of the HAR particled VSD material, forming current carrying traces and elements on the device.

In particular, one or more embodiments for electroplating onto devices includes using HAR particled VSD material that has reduced metallic loading through use of high-aspect ratio particles in filler material. Such formulation enables longer pulse time for performing the plating steps of 720 and 730, as compared to conventional VSD materials. Moreover, use of HAR particled VSD material increases a likelihood that the VSD material will retain its integrity after the plating process. This means that the trace elements may be provided with inherent grounding capabilities that can be integrated into the device.

Consistent with an embodiment of FIG. 7, use of VSD material in accordance with embodiments described herein may be applied to any of the electroplating techniques described in U.S. Pat. No. 6,797,145. Electroplating techniques with HAR particled VSD material as described may be used to (i) create vias on a substrate device, (ii) multi-sided substrate devices having current carrying patterns on each side, and/or (iii) interconnecting vias between multi-sided substrate devices having current carrying patterns on each side.

Other Applications

Figure 8:
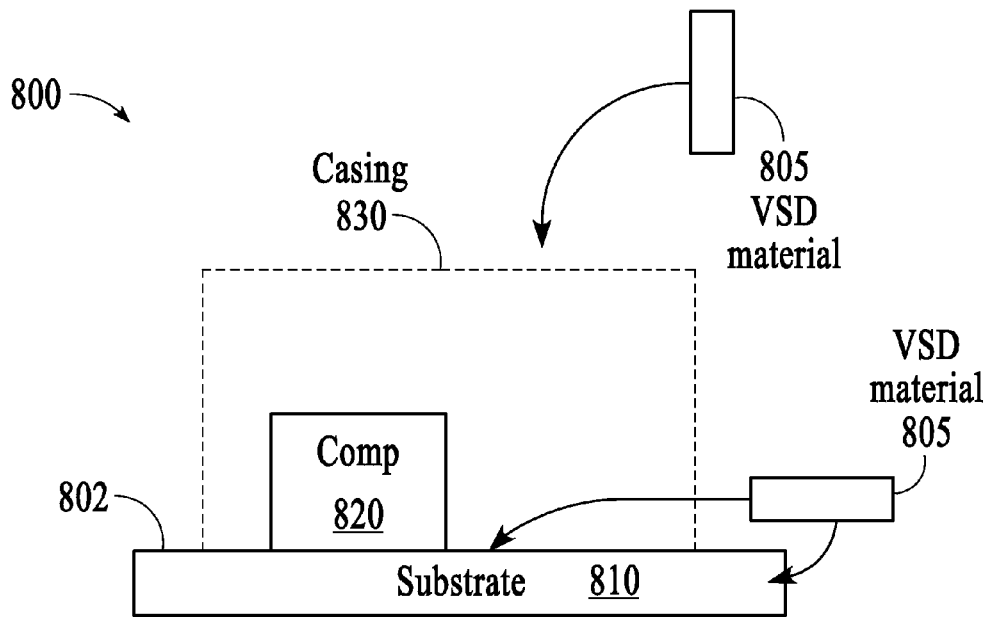
FIG. 8 is a simplified diagram of an electronic device on which VSD material in accordance with embodiments described herein may be provided.

FIG. 8 is a simplified diagram of an electronic device on which VSD material in accordance with embodiments described herein may be provided. FIG. 8 illustrates a device 800 including substrate 810, component 820, and optionally casing or housing 830. VSD material 805 may be incorporated into any one or more of many locations, including at a location on a surface 802, underneath the surface 802 (such as under its trace elements or under component 820), or within a thickness of substrate 810. Alternatively, the VSD material may be incorporated into the casing 830. In each case, the VSD material 805 may be incorporated so as to couple with conductive elements, such as trace leads, when voltage exceeding the characteristic voltage is present. Thus, the VSD material 805 is a conductive element in the presence of a specific voltage condition.

With respect to any of the applications described herein, device 800 may be a display device. For example, component 820 may correspond to an LED that illuminates from the substrate 810. The positioning and configuration of the VSD material 805 on substrate 810 may be selective to accommodate the electrical leads, terminals (i.e. input or outputs) and other conductive elements that are provided with, used by or incorporated into the light-emitting device. As an alternative, the VSD material may be incorporated between the positive and negative leads of the LED device, apart from a substrate. Still further, one or more embodiments provide for use of organic LEDs, in which case VSD material may be provided, for example, underneath the OLED.

With regard to LEDs, any of the embodiments described in U.S. patent application Ser. No. 11/562,289 (which is incorporated by reference herein) may be implemented with VSD material containing a binder with conductive/semi-conductive HAR particles in filler material, in accordance with any of the embodiments described herein.

Alternatively, the device 800 may correspond to a wireless communication device, such as a radio-frequency identification device. With regard to wireless communication devices such as radio-frequency identification devices (RFID) and wireless communication components, VSD material may protect a component 820 from, for example, overcharge or ESD events. In such cases, component 820 may correspond to a chip or wireless communication component of the device. Alternatively, the use of VSD material 805 may protect other components from charge that may be caused by the component 820. For example, component 820 may correspond to a battery, and the VSD material 805 may be provided as a trace element on a surface of the substrate 810 to protect against voltage conditions that arise from a battery event.

Any of the embodiments described in U.S. patent application Ser. No. 11/562,222 (which is incorporated by reference herein) may be implemented with VSD material containing a binder with conductive/semi-conductive high aspect-ratio particles, in accordance with any of the embodiments described herein.

As an alternative or variation, the component 820 may correspond to, for example, a discrete semiconductor device. The VSD material 805 may be integrated with the component, or positioned to electrically couple to the component in the presence of a voltage that switches the material on.

Still further, device 800 may correspond to a packaged device, or alternatively, a semiconductor package for receiving a substrate component. VSD material 805 may be combined with the casing 830 prior to substrate 810 or component 820 being included in the device.

CONCLUSION

Embodiments described with reference to the drawings are considered illustrative, and Applicant's claims should not be limited to details of such illustrative embodiments. Various modifications and variations may be included with embodiments described, including the combination of features described separately with different illustrative embodiments. Accordingly, it is intended that the scope of the invention be defined by the following claims. Furthermore, it is contemplated that a particular feature described either individually or as part of an embodiment can be combined with other individually described features, or parts of other embodiments, even if the other features and embodiments make no mentioned of the particular feature.

What is claimed is:

1. An electronic device comprising:
a layer of voltage switchable dielectric (VSD) material formed by:
(i) creating a mixture, the mixture comprising a polymer binder, a first set of conductor and/or semi-conductor particles, and a second set of nanoscale high aspect (HAR) particles other than said first set of conductor and/or semi-conductor particles;
(ii) applying the mixture to a substrate; and
(iii) curing the mixture on the substrate;
wherein an amount of particles dispersed in the binder, including the first set of conductor and/or semi-conductor particles and the second set of nanoscale HAR particles, is sufficiently low so that a percolation threshold of the VSD material is not reached.

2. The electronic device of claim 1, further comprising:
a first electrode and a second electrode, and
wherein the mixture is applied to a span between the first and second electrode.

3. The electronic device of claim 1, wherein the layer of VSD material is provided as a layer within a thickness of the substrate.

4. The electronic device of claim 3, wherein the layer of VSD material underlies one or more contact elements for connecting the substrate to another device, and wherein the one or more contact elements include an aperture to electrically connect a surface of an individual contact element to the layer of VSD material.

5. The electronic device of claim 1, wherein the electronic device is a device selected from a group consisting of a light-emitting diode, a radio-frequency device, a discrete device, and a semi-conductor package.

6. The electronic device of claim 1, wherein the first set of conductor and/or semi-conductor particles and the second set of nanoscale high aspect ratio (HAR) particles are substantially uniformly distributed in the binder.

7. The electronic device of claim 6, wherein the second set of nanoscale high aspect ratio (HAR) particles comprise single and/or multi-walled carbon nanotubes.

8. The electronic device of claim 1, wherein the conductor and/or semiconductor particles include a metal or a metal complex.

9. The electronic device of claim 1, wherein creating the mixture comprises:
creating a resin mixture including the polymer binder and the second set of nanoscale HAR particles; and
creating the mixture by adding the first set of conductor and/or semi-conductor particles to the resin mixture.

10. The electronic device of claim 1, wherein the first set of conductor and/or semi-conductor comprise conductor particles that have a concentration by percentage of volume that ranges between 0.01-70%.

11. The electronic device of claim 1, wherein the first set of conductor and/or semi-conductor comprise semi-conductor particles that have a concentration by percentage of volume that ranges between 0.01-95%.

12. The electronic device of claim 1, wherein the binder has a concentration by percentage of volume that ranges between 5-99%.

13. An electronic device comprising:
a layer of voltage switchable dielectric (VSD) material formed by:
(i) creating a mixture, the mixture comprising a polymer binder, a first set of conductor and/or semi-conductor particles, and a second set of nanoscale high aspect (HAR) particles other than said first set of conductor and/or semi-conductor particles;
(ii) applying the mixture to a target region of a substrate; and
(iii) curing the mixture on the substrate;
wherein an amount of particles dispersed in the binder, including the first set of conductor and/or semi-conductor particles and the second set of nanoscale HAR particles, is sufficiently low so that a percolation threshold of the VSD material is not reached.

14. The electronic device of claim 13, further comprising:
a first electrode and a second electrode, and
wherein target region is a span between the first and second electrode.

15. The electronic device of claim 14, wherein applying the mixture to the target region of the substrate comprises:
applying the mixture to an area including the target region;
covering the target region with a mask; and
removing portion of the mixture not covered by the mask.

16. The electronic device of claim 13, wherein curing the mixture on the substrate comprises:
immersing the substrate with the mixture applied to the target region in an electrolytic solution; and
applying a voltage to the electrolytic solution.

17. The electronic device of claim 16, wherein applying the voltage to the electrolytic solution comprises applying a number of voltage pules to the electrolytic solution, wherein the duration of the applied voltage pulses is less than a breakdown time of the VSD material.

18. An electronic device comprising:
a layer of voltage switchable dielectric (VSD) material formed by:
(i) creating a mixture, the mixture comprising a polymer binder, a first set of conductor and/or semi-conductor particles, and a second set of nanoscale high aspect (HAR) particles other than said first set of conductor and/or semi-conductor particles;
(ii) applying the mixture to a substrate; and
(iii) curing the mixture on the substrate;
wherein an amount of particles dispersed in the binder, including the first set of conductor and/or semi-conductor particles and the second set of nanoscale HAR particles, is sufficiently low so that a percolation threshold of the VSD material is not reached, and wherein the HAR particles have a concentration by percentage of volume that ranges between 0.01-95%.

* * * * *